(12) United States Patent
Yang et al.

(10) Patent No.: US 10,574,491 B2
(45) Date of Patent: Feb. 25, 2020

(54) SIGNAL DISTRIBUTION CIRCUIT AND SIGNAL DISTRIBUTION CIRCUIT SYSTEM

(71) Applicant: Huawei Technologies Co., Ltd., Shenzhen (CN)

(72) Inventors: Jinda Yang, Shenzhen (CN); Qing Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/058,431

(22) Filed: Aug. 8, 2018

(65) Prior Publication Data
US 2019/0052491 A1    Feb. 14, 2019

(30) Foreign Application Priority Data

Aug. 10, 2017    (CN) ............... 2017 1 0684145

(51) Int. Cl.
| | | |
|---|---|---|
| H04L 27/04 | (2006.01) | |
| H04B 1/04 | (2006.01) | |
| H03F 3/193 | (2006.01) | |
| H03G 3/30 | (2006.01) | |

(Continued)

(52) U.S. Cl.
CPC ............ *H04L 27/04* (2013.01); *H03F 3/193* (2013.01); *H03F 3/45179* (2013.01);
(Continued)

(58) Field of Classification Search
CPC ....... H04B 1/04; H03F 3/193; H03F 3/45179; H03F 3/45645; H03F 2200/129;
(Continued)

(56) References Cited

U.S. PATENT DOCUMENTS

| | | | | | |
|---|---|---|---|---|---|
| 4,078,157 | A | * | 3/1978 | Lender | ................ H04B 3/145 178/70 R |
| 6,519,196 | B1 | * | 2/2003 | Jang | .................... G11C 7/1051 365/205 |

(Continued)

FOREIGN PATENT DOCUMENTS

| | | |
|---|---|---|
| CN | 101454843 A | 6/2009 |
| CN | 102882526 A | 1/2013 |

(Continued)

OTHER PUBLICATIONS

Foreign Communication From A Counterpart Application, Chinese Application No. 201710684145.1, Chinese Office Action dated Jan. 3, 2020, 10 pages.

*Primary Examiner* — Ted M Wang
(74) *Attorney, Agent, or Firm* — Conley Rose, P.C.

(57) ABSTRACT

A signal distribution circuit including an equalization circuit, a signal distribution part, an operational amplifying circuit, a feedback circuit, and a time sequence circuit. The equalization circuit is configured to collect an initial broadband signal. The signal distribution part is configured to distribute a first-stage broadband signal resulting from amplitude attenuation process to obtain a plurality of same second-stage broadband signals. The operational amplifying circuit is configured to perform amplification processing on the second-stage broadband signal obtained after distribution to obtain a third-stage broadband signal. The feedback circuit is configured to feedback the third-stage broadband signal to the equalization circuit. The time sequence circuit is configured to adjust an amplification gain of the third-stage broadband signal, and transmit the third-stage broadband signal to an analog to digital converter.

20 Claims, 5 Drawing Sheets

(51) Int. Cl.
*H03F 3/45* (2006.01)
*H03M 1/12* (2006.01)
*H03M 9/00* (2006.01)

(52) U.S. Cl.
CPC ....... *H03F 3/45645* (2013.01); *H03G 3/3042* (2013.01); *H04B 1/04* (2013.01); *H03F 2200/129* (2013.01); *H03F 2203/45066* (2013.01); *H03F 2203/45116* (2013.01); *H03F 2203/45544* (2013.01); *H03F 2203/45554* (2013.01); *H03G 2201/103* (2013.01); *H03M 1/1215* (2013.01); *H03M 9/00* (2013.01)

(58) Field of Classification Search
CPC . H03F 2203/45116; H03F 2203/45554; H03F 2203/45544; H03F 2203/45006; H03G 3/3042; H03G 2201/103; H04L 27/2332; H04L 27/2331; H04L 27/22; H04L 25/4904; H04L 7/0331; H04L 27/04; H03M 1/1215; H03M 9/00
See application file for complete search history.

(56) References Cited

U.S. PATENT DOCUMENTS

| | | | |
|---|---|---|---|
| 6,982,664 | B1 | 1/2006 | Nairn |
| 9,041,573 | B2 | 5/2015 | Kull et al. |
| 2007/0279507 | A1 | 12/2007 | Anthony |
| 2008/0238588 | A1 | 10/2008 | Yeung et al. |
| 2011/0299585 | A1* | 12/2011 | Tomita ............. H04L 25/03057 375/236 |
| 2014/0009316 | A1 | 1/2014 | Chou et al. |
| 2014/0064351 | A1* | 3/2014 | Hidaka .................. H04L 27/01 375/232 |
| 2014/0176354 | A1 | 6/2014 | Yang |
| 2014/0292551 | A1 | 10/2014 | Kull et al. |

FOREIGN PATENT DOCUMENTS

| | | |
|---|---|---|
| CN | 103532501 A | 1/2014 |
| CN | 104079299 | 10/2014 |

* cited by examiner

Voltage timing
diagram

SIGNAL DISTRIBUTION CIRCUIT AND SIGNAL DISTRIBUTION CIRCUIT SYSTEM

CROSS-REFERENCE TO RELATED APPLICATION

This application claims priority to Chinese Patent Application No. 201710684145.1 filed on Aug. 10, 2017, which is hereby incorporated by reference in its entirety.

TECHNICAL FIELD

This application relates to the communications field, and in particular, to a signal distribution circuit and a signal distribution circuit system.

BACKGROUND

In the wired communications field, a data transmission rate is increasingly high. A conventional transmission method based on serializer/deserializer (SerDes) and non-return-to-zero (NRZ) code modulation is increasingly restricted by physical bandwidth of a package, a device, or the like. A solution based on digital high order modulation, an analog to digital converter (also referred to as ADC), and a digital to analog converter (also referred to as DAC) is becoming a hot alternative solution with a breakthrough in a transmission speed in current high-speed wired communications.

Existing signal distribution circuits (inputdemux) are mainly classified into two types technically a current-type inputdemux and a voltage-type inputdemux. An existing voltage-type signal distribution circuit is shown in FIG. 1. A high-speed voltage signal directly passes through a two-stage N-channel metal oxide semiconductor (NMOS) switch 101, and is sampled on a second-stage capacitor. At a hold phase, a voltage buffer, namely, a P-channel metal oxide semiconductor (PMOS) source follower, is used to further distribute a voltage signal obtained by sampling to a sampling capacitor of a third-stage sub analog to digital converter (sub ADC) 102. Sampling is performed twice during an entire signal distribution period.

In the existing voltage-type signal distribution circuit solution, there are disadvantages of relatively low signal bandwidth and poor signal linearity.

SUMMARY

Embodiments of this application provide a signal distribution circuit and a distribution circuit system to increase signal bandwidth and improve signal linearity.

A first aspect of the embodiments of this application provides a signal distribution circuit, including an equalization circuit module, a signal distribution module, an operational amplifying module, a feedback circuit module, and a time sequence module. The equalization circuit module is configured to collect an initial broadband signal, perform amplitude attenuation processing on the collected initial broadband signal to obtain a first-stage broadband signal, and transmit the first-stage broadband signal to the signal distribution module. The signal distribution module is configured to distribute the first-stage broadband signal resulting from amplitude attenuation processing to obtain a plurality of same second-stage broadband signals, and transmit the second-stage broadband signals to the operational amplifying module. The operational amplifying module is configured to perform amplification processing on the second-stage broadband signal obtained after distribution to obtain a third-stage broadband signal in order to compensate for an attenuated amplitude of the initial broadband signal, and transmit the third-stage broadband signal to the feedback circuit module and the time sequence module. The feedback circuit module is configured to feedback the third-stage broadband signal to the equalization circuit module. The time sequence module is configured to adjust an amplification gain of the third-stage broadband signal, and transmit the third-stage broadband signal to an analog to digital converter.

In a possible design, in a first implementation of the first aspect of the embodiments of this application, the equalization circuit module includes a resistor R1, a resistor R2, a resistor R3, a resistor R4, an inductor L1, an inductor L2, an inductor L3, an inductor L4, a capacitor C1, and a capacitor C2.

In a possible design, in a second implementation of the first aspect of the embodiments of this application, the resistor R1 is connected to the capacitor C1 in parallel, where a first terminal of the resistor R1 is connected to a first terminal of the capacitor C1, and a second terminal of the resistor R1 is connected to a second terminal of the capacitor C1. The resistor R4 is connected to the capacitor C2 in parallel, where a first terminal of the resistor R4 is connected to a first terminal of the capacitor C2, and a second terminal of the resistor R4 is connected to a second terminal of the capacitor C2. The inductor L1 is connected to the resistor R1 in series, where a first terminal of the inductor L1 is connected to a signal source Vip, and a second terminal of the inductor L1 is connected to the first terminal of the resistor R1. The second terminal of the resistor R1 is connected to a common-mode configuration circuit of the feedback circuit module using the inductor L2 and the resistor R2. The inductor L4 is connected to the resistor R4 in series, where a first terminal of the inductor L4 is connected to a signal source Vin, a second terminal of the inductor L4 is connected to a first terminal of the resistor R4, and the second terminal of the resistor R4 is connected to the common-mode configuration circuit of the feedback circuit module using the inductor L3 and the resistor R3.

In a possible design, in a third implementation of the first aspect of the embodiments of this application, the signal distribution module includes four first-stage switch submodules, and all the first-stage switch submodules are connected in parallel, and each first-stage switch submodule is connected to four second-stage switch submodules, all the second-stage switch submodules are connected in parallel, the second-stage switch submodule is connected to a sampling capacitor Cs, and the second-stage switch submodule has a same structure as that of the first-stage switch submodule.

In a possible design, in a fourth implementation of the first aspect of the embodiments of this application, the first-stage switch submodule includes a metal-oxide semiconductor (MOS) transistor Q1, a MOS transistor Q2, an amplifier A1, and a capacitor C3, and the second-stage switch submodule includes a MOS transistor Q3, a MOS transistor Q4, an amplifier A2, and a capacitor C4. A drain of the MOS transistor Q1 is connected to a power source AVDD, a source of the MOS transistor Q1 is connected to a gate of the MOS transistor Q2, and a gate of the MOS transistor Q1 is connected to a bias voltage Vbottom. A drain of the MOS transistor Q3 is connected to the power source AVDD, a source of the MOS transistor Q3 is connected to a gate of the MOS transistor Q4, and a gate of the MOS transistor Q3 is connected to the bias voltage Vbottom. A source of the MOS transistor Q2 is connected to a drain of the MOS transistor Q4, a drain of the MOS transistor Q2 is connected to the passive broadband equalization circuit module, and a source of the MOS transistor Q4 is connected to the operational amplifying module. An input terminal of the amplifier A1 receives a clock signal, an output terminal of the amplifier A1 is connected to one terminal of the capacitor C3, and another terminal of the capacitor C3 is connected to the source of the MOS transistor Q1. An input terminal of the amplifier A2 receives a clock signal, an output terminal of the amplifier A2 is connected to one terminal of the capacitor C4, and another terminal of the capacitor C4 is connected to the source of the MOS transistor Q3. The first-stage broadband signal is input from the drain of the MOS transistor Q2, and output from the source of the MOS transistor Q4.

In a possible design, in a fifth implementation of the first aspect of the embodiments of this application, the operational amplifying module includes a MOS transistor Q5, a MOS transistor Q6, a MOS transistor Q7, and a MOS transistor Q8.

In a possible design, in a sixth implementation of the first aspect of the embodiments of this application, a drain of the MOS transistor Q7 is connected to a power source AVDD, a gate of the MOS transistor Q7 receives a clock signal, and a source of the MOS transistor Q7 is connected to a source of the MOS transistor Q5. A drain of the MOS transistor Q8 is grounded, a gate of the MOS transistor Q8 receives a clock signal, and a source of the MOS transistor Q8 is connected to a source of the MOS transistor Q6. A gate of the MOS transistor Q5 is connected to a gate of the MOS transistor Q6, a drain of the MOS transistor Q5 is connected to a drain of the MOS transistor Q6, the gate of the MOS transistor Q5 is connected to the signal distribution module, and the drain of the MOS transistor Q5 is connected to the time sequence module. The second-stage broadband signal is input from the gate of the MOS transistor Q5, and output from the drain of the MOS transistor Q5.

In a possible design, in a seventh implementation of the first aspect of the embodiments of this application, the time sequence module includes a switch S1, a switch S2, and a capacitor C5.

In a possible design, in an eighth implementation of the first aspect of the embodiments of this application, a first terminal of the switch S1 is connected to the operational amplifying module, a second terminal of the switch S1 is connected to a first terminal of the switch S2, and the second terminal of the switch S1 is connected to a first terminal of the capacitor C5. A second terminal of the switch S2 is grounded, and a second terminal of the capacitor C5 is grounded. The third-stage broadband signal is input from the first terminal of the switch S1, and output from the second terminal of the switch S1.

In a possible design, in a ninth implementation of the first aspect of the embodiments of this application, the feedback circuit module includes a common-mode obtaining circuit, a low-speed analog to digital converter, a digital signal processor, and a common-mode configuration circuit.

A second aspect of the embodiments of this application provides a signal distribution circuit system, including a signal source, a clock signal circuit, a signal distribution circuit, and a sub analog to digital converter. The signal source is configured to provide a broadband signal. The clock signal circuit is configured to control a distribution process of the broadband signal using the signal distribution circuit. The signal distribution circuit is configured to distribute the broadband signal, and the signal distribution circuit includes the signal distribution circuit according to any one of the first aspect of this application to the ninth implementation of the first aspect. The sub analog to digital converter is configured to convert the distributed broadband signal from an analog signal into a digital signal.

In the technical solutions provided in the embodiments of this application, the signal distribution circuit includes the equalization circuit module, the signal distribution module, the operational amplifying module, the feedback circuit module, and the time sequence module. The equalization circuit module is configured to collect the initial broadband signal, perform amplitude attenuation processing on the collected initial broadband signal to obtain the first-stage broadband signal, and transmit the first-stage broadband signal to the signal distribution module. The signal distribution module is configured to distribute the first-stage broadband signal resulting from amplitude attenuation processing to obtain the plurality of same second-stage broadband signals, and transmit the second-stage broadband signals to the operational amplifying module. The operational amplifying module is configured to perform amplification processing on the second-stage broadband signal obtained after distribution to obtain the third-stage broadband signal in order to compensate for an attenuated amplitude of the initial broadband signal, and transmit the third-stage broadband signal to the feedback circuit module and the time sequence module. The feedback circuit module is configured to feedback the third-stage broadband signal to the equalization circuit module. The time sequence module is configured to adjust an amplification gain of the third-stage broadband signal, and transmit the third-stage broadband signal to the analog to digital converter. In the embodiments of this application, after a broadband signal passes through the signal distribution circuit, signal bandwidth is increased, and signal linearity is improved.

DESCRIPTION OF EMBODIMENTS

The embodiments of this application provide a signal distribution circuit and a distribution circuit system to increase signal bandwidth and improve signal linearity.

To make persons skilled in the art understand the solutions in this application better, the following describes the embodiments of this application with reference to the accompanying drawings in the embodiments of this application.

In the specification, claims, and accompanying drawings of this application, the terms "first," "second," "third,"

"fourth," and so on (if existent) are intended to distinguish between similar objects but do not necessarily indicate a specific order or sequence. It should be understood that the data termed in such a way are interchangeable in proper circumstances so that the embodiments described herein can be implemented in other orders than the order illustrated or described herein. Moreover, the terms "including," "comprising," and any other variants are intended to cover non-exclusive inclusions, for example, a process, method, system, product, or device that includes a list of steps or units is not necessarily limited to those steps or units, but may include other steps or units not expressly listed or inherent to such a process, method, product, or device.

Figure 1:
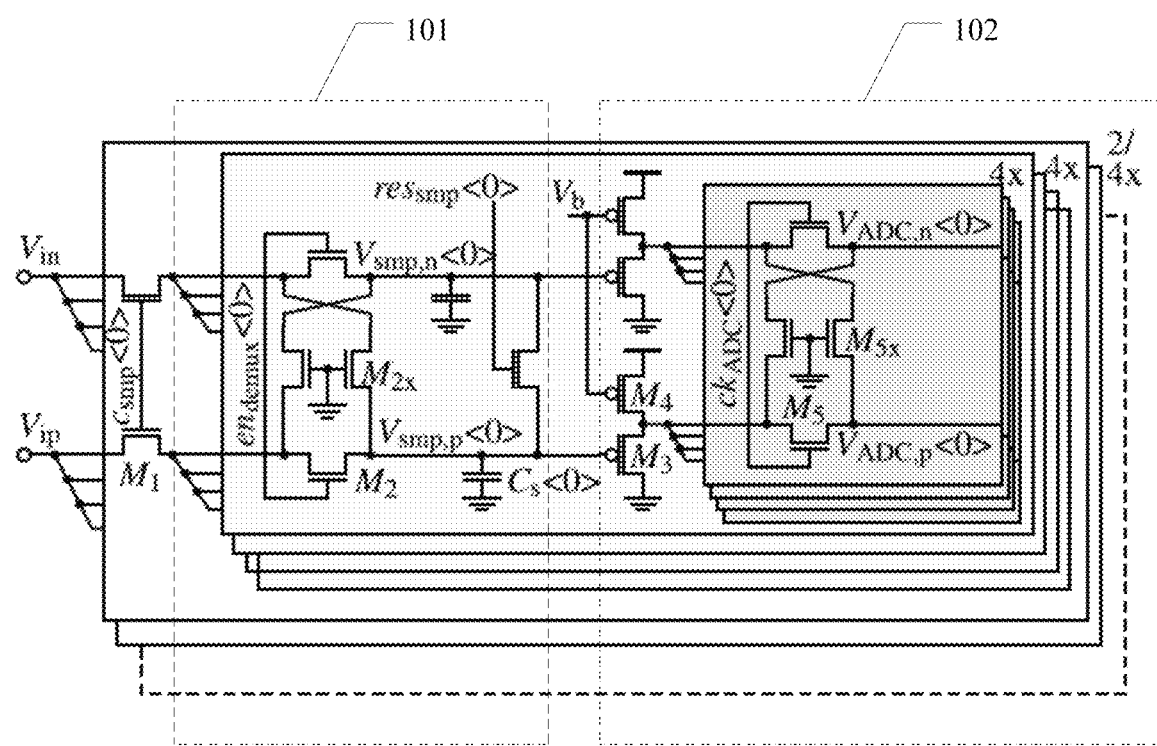
FIG. 1 is a schematic structural diagram of a signal distribution circuit.
Figure 2:
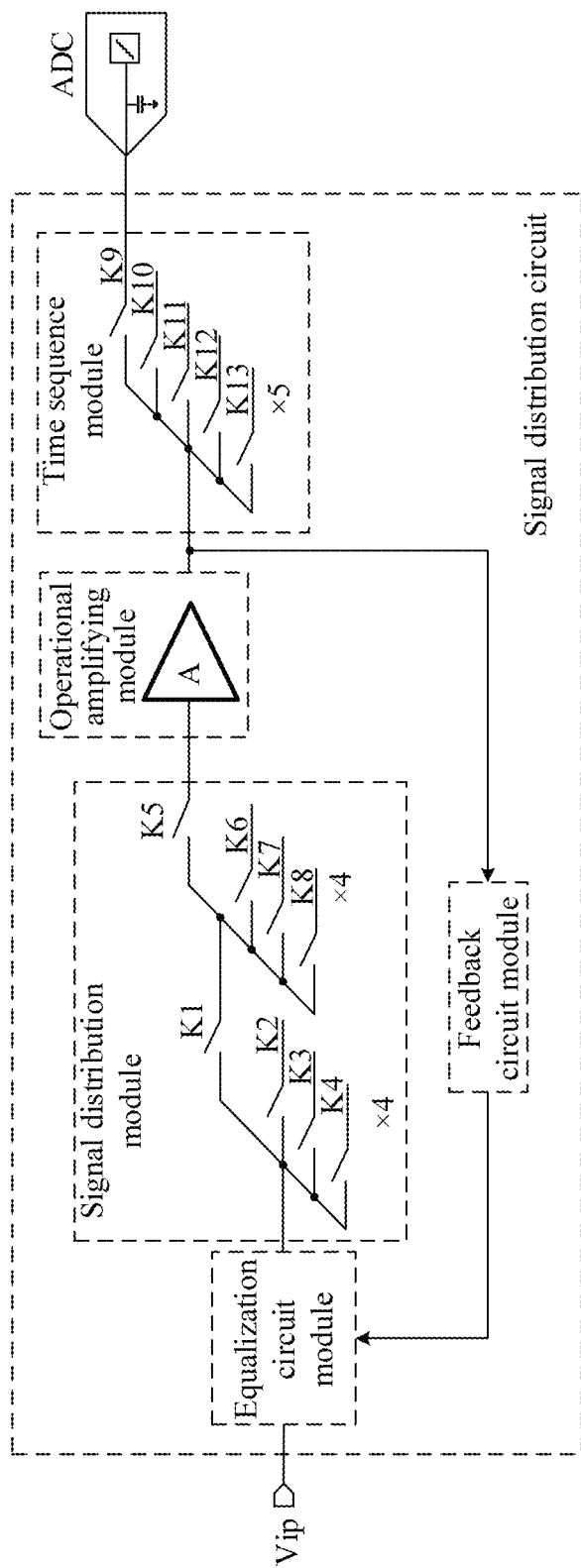
FIG. 2 is a schematic diagram of an embodiment of a signal distribution circuit according to an embodiment of this application.

Referring to FIG. 2, an embodiment of a signal distribution circuit in an embodiment of this application includes an equalization circuit module, a signal distribution module, an operational amplifying module, a feedback circuit module, and a time sequence module.

The equalization circuit module is configured to collect an initial broadband signal, perform amplitude attenuation processing on the collected initial broadband signal to obtain a first-stage broadband signal, and transmit the first-stage broadband signal to the signal distribution module.

The signal distribution module is configured to distribute the first-stage broadband signal resulting from amplitude attenuation processing to obtain a plurality of same second-stage broadband signals, and transmit the second-stage broadband signals to the operational amplifying module.

The operational amplifying module is configured to perform amplification processing on the second-stage broadband signal obtained after distribution to obtain a third-stage broadband signal in order to compensate for an attenuated amplitude of the initial broadband signal, and transmit the third-stage broadband signal to the feedback circuit module and the time sequence module.

The feedback circuit module is configured to feedback the third-stage broadband signal to the equalization circuit module.

The time sequence module is configured to adjust an amplification gain of the third-stage broadband signal, and transmit the third-stage broadband signal to an analog to digital converter.

It should be noted that the initial broadband signal transmitted in the signal distribution circuit includes many sine components of different frequencies, and there is a determined relationship between amplitudes or between phases of these sine components. For example, a voltage signal received by the signal distribution circuit is a broadband signal. To ensure quality of the transmitted broadband signal, it is required that the relationship between amplitudes or between phases of the sine components remain unchanged in a transmission process. The transmission is referred to as distortionless transmission. However, actually when a signal passes through a linear system (for example, a circuit including a resistance element), a relationship between amplitudes or between phases of sine components of different frequencies changes. Therefore, a distortion occurs on a broadband signal waveform. To reduce broadband signal distortions, specific to various distortion characteristics, the equalization circuit module is added to the signal distribution circuit to correct an amplitude distortion of the sine components of different frequencies. The equalization circuit module may also be referred to as a bandwidth attenuation equalization circuit module. The equalization circuit module includes a plurality of passive elements, such as a resistor, an inductor, and a capacitor. Therefore, the equalization circuit module may also be referred to as a passive broadband equalization circuit module.

When the first-stage broadband signal passes through the signal distribution module, the first-stage broadband signal is divided into a plurality of broadband signals with a same value, namely, the second-stage broadband signals. A quantity of the second-stage broadband signals is determined based on a circuit structure of the signal distribution module, and this is not limited herein.

In this embodiment of this application, the equalization circuit module obtains the initial broadband signal from a signal source. After the initial broadband signal passes through the equalization circuit module, the first-stage broadband signal resulting from amplitude attenuation processing is obtained. The first-stage broadband signal passes through the signal distribution module, and the first-stage broadband signal resulting from amplitude attenuation processing is distributed to obtain a plurality of same broadband signals, namely, the second-stage broadband signals. The broadband signal obtained after distribution undergoes amplification processing performed by the operational amplifying module, and the obtained third-stage broadband signal is fed back to the equalization circuit module. After passing through the time sequence module, the third-stage broadband signal is transmitted to the analog to digital converter. In this embodiment of this application, after the initial broadband signal first passes through the equalization circuit module, a broadband signal with a reduced amplitude is obtained. When other conditions remain unchanged, because output resistance of the equalization circuit module is reduced, bandwidth of the equalization circuit is increased, and therefore bandwidth of the signal distribution circuit is increased. The broadband signal with the reduced amplitude passes through the distribution module. Because an amplitude of the broadband signal is reduced, linearity of the distribution module is improved. An amplitude of the broadband signal obtained after distribution performed by the distribution module is amplified by the operational amplifying module to meet a requirement of a next-stage module for an input amplitude of the broadband signal.

Figure 3:
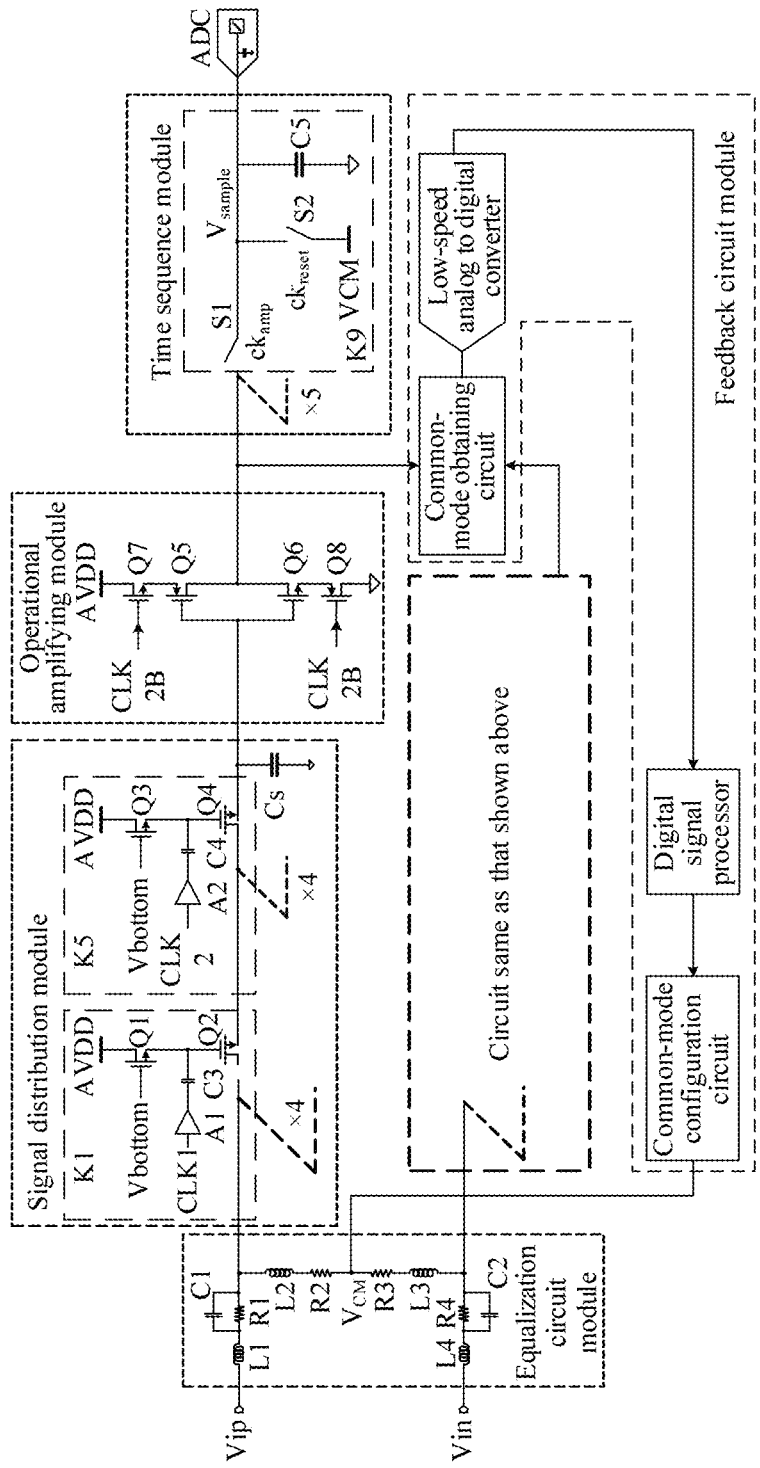
FIG. 3 is a schematic diagram of another embodiment of a signal distribution circuit according to an embodiment of this application.

Referring to FIG. 3, another embodiment of a signal distribution circuit in an embodiment of this application includes an equalization circuit module, a signal distribution module, an operational amplifying module, a feedback circuit module, and a time sequence module.

The equalization circuit module is configured to collect an initial broadband signal, perform amplitude attenuation processing on the collected initial broadband signal to obtain a first-stage broadband signal, and transmit the first-stage broadband signal to the signal distribution module.

The signal distribution module is configured to distribute the first-stage broadband signal resulting from amplitude attenuation processing to obtain a plurality of same second-stage broadband signals, and transmit the second-stage broadband signals to the operational amplifying module.

The operational amplifying module is configured to perform amplification processing on the second-stage broadband signal obtained after distribution to obtain a third-stage broadband signal in order to compensate for an attenuated amplitude of the initial broadband signal, and transmit the third-stage broadband signal to the feedback circuit module and the time sequence module.

The feedback circuit module is configured to feedback the third-stage broadband signal to the equalization circuit module.

The time sequence module is configured to adjust an amplification gain of the third-stage broadband signal, and transmit the third-stage broadband signal to an analog to digital converter.

In an operational implementation, the equalization circuit module includes a resistor R1, a resistor R2, a resistor R3, a resistor R4, an inductor L1, an inductor L2, an inductor L3, an inductor L4, a capacitor C1, and a capacitor C2.

The resistor R1 is connected to the capacitor C1 in parallel. A first terminal of the resistor R1 is connected to a first terminal of the capacitor C1, and a second terminal of the resistor R1 is connected to a second terminal of the capacitor C1. The resistor R4 is connected to the capacitor C2 in parallel. A first terminal of the resistor R4 is connected to a first terminal of the capacitor C2, and a second terminal of the resistor R4 is connected to a second terminal of the capacitor C2.

The inductor L1 is connected to the resistor R1 in series. A first terminal of the inductor L1 is connected to a signal source Vip, a second terminal of the inductor L1 is connected to the first terminal of the resistor R1, and the second terminal of the resistor R1 is connected to a common-mode configuration circuit of the feedback circuit module using the inductor L2 and the resistor R2.

The inductor L4 is connected to the resistor R4 in series. A first terminal of the inductor L4 is connected to a signal source Vin, a second terminal of the inductor L4 is connected to a first terminal of the resistor R4, and the second terminal of the resistor R4 is connected to the common-mode configuration circuit of the feedback circuit module using the inductor L3 and the resistor R3.

It can be understood that elements such as the inductor L1, the inductor L2, the inductor L3, the inductor L4, the capacitor C1, and the capacitor C2 are configured to reduce an attenuation speed of a high-frequency broadband signal, and extend bandwidth of the equalization circuit module. Therefore, the equalization circuit module may include only a resistance element. For example, the equalization circuit module includes the resistor R1, the resistor R2, the resistor R3, and the resistor R4. In this case, a resistance value of the resistor R1 is the same as that of the resistor R2. After a voltage signal Vip passes through the resistor R1, a voltage of the voltage signal Vip output to the signal distribution module is ½ Vip, and an amplitude of the voltage signal is reduced. Similarly, when a resistance value of the resistor R3 is the same as that of the resistor R4, an amplitude of a voltage signal Vin is reduced to half of an original value. When the signal source includes only one signal Vip or Vin, the equalization circuit module may alternatively include some resistance elements. For example, the equalization circuit module includes the resistor R1 and the resistor R2. In this case, a resistance value of the resistor R1 is the same as that of the resistor R2. After a voltage signal Vip passes through the resistor R1, a voltage of the voltage signal Vip output to the signal distribution module is ½ Vip, and an amplitude of the voltage signal is reduced. There may be other cases, and this is not limited herein. When resistance values of resistors are different, degrees of amplitude attenuation of voltage signals are different, and this is not limited herein.

It should be noted that, in this embodiment of this application, the equalization circuit module obtains the initial broadband signal from the signal source, and performs voltage division using series resistors of the equalization circuit, thereby reducing an amplitude of an output broadband signal, and extending bandwidth of the equalization circuit. An inductor and a capacitor of the equalization circuit module are configured to additionally cancel an effect of package parasitic capacitance. In addition, the inductor and the capacitor form two zero points at a frequency band, thereby further extending signal bandwidth. A signal amplitude on a sampling channel in the equalization circuit module is reduced, thereby further improving high-frequency sampling linearity of the signal distribution module.

In an operational implementation, the signal distribution module includes four first-stage switch submodules, and all the first-stage switch submodules are connected in parallel.

Each first-stage switch submodule is connected to four second-stage switch submodules, all the second-stage switch submodules are connected in parallel, the second-stage switch submodule is connected to a sampling capacitor Cs, and the second-stage switch submodule has a same structure as that of the first-stage switch submodule.

It can be understood that, to ensure consistency of broadband signals passing through the switch modules, the first-stage switch submodule has a same structure as that of the second-stage switch submodule. The sampling capacitor Cs is configured to output a stable voltage signal after the signal distribution module completes sampling.

Referring to FIG. 3, in an optional embodiment, the first-stage switch submodule includes a MOS transistor Q1, a MOS transistor Q2, an amplifier A1, and a capacitor C3. The second-stage switch submodule includes a MOS transistor Q3, a MOS transistor Q4, an amplifier A2, and a capacitor C4.

A drain of the MOS transistor Q1 is connected to a power source AVDD, a source of the MOS transistor Q1 is connected to a gate of the MOS transistor Q2, a gate of the MOS transistor Q1 is connected to a bias voltage Vbottom, a drain of the MOS transistor Q3 is connected to the power source AVDD, a source of the MOS transistor Q3 is connected to a gate of the MOS transistor Q4, and a gate of the MOS transistor Q3 is connected to the bias voltage Vbottom.

A source of the MOS transistor Q2 is connected to a drain of the MOS transistor Q4, a drain of the MOS transistor Q2 is connected to the passive broadband equalization circuit module, and a source of the MOS transistor Q4 is connected to the operational amplifying module.

An input terminal of the amplifier A1 receives a clock signal, an output terminal of the amplifier A1 is connected to one terminal of the capacitor C3, and another terminal of the capacitor C3 is connected to the source of the MOS transistor Q1.

An input terminal of the amplifier A2 receives a clock signal, an output terminal of the amplifier A2 is connected to one terminal of the capacitor C4, and another terminal of the capacitor C4 is connected to the source of the MOS transistor Q3.

The first-stage broadband signal is input from the drain of the MOS transistor Q2, and output from the source of the MOS transistor Q4.

It should be noted that the signal distribution module resolves two problems in high-speed top-plate sampling. One problem is asynchronization between phases of a P transistor and an N transistor when a conventional complementary MOS (CMOS) switch is used (if an individual NMOS or PMOS is used, a common mode cannot be randomly set, and a problem may occur during working of a next-stage dynamic operational amplifier). The other problem is that time of rising and falling edges is relatively long when a conventional bootstrap switch is used, and the conventional bootstrap switch is not applicable to high-speed sampling. A direct current level setting circuit, working as an NMOS source follower, is configured to set a lowest electrical level for working of a boosting switch of the signal distribution module, and a highest electrical level is determined based on an input amplitude of a clock signal.

In a operational implementation, referring to FIG. 3, the operational amplifying module includes a MOS transistor Q5, a MOS transistor Q6, a MOS transistor Q7, and a MOS transistor Q8.

Referring to FIG. 3, in an optional embodiment, a drain of the MOS transistor Q7 is connected to a power source AVDD, a gate of the MOS transistor Q7 receives a clock signal, and a source of the MOS transistor Q7 is connected to a source of the MOS transistor Q5.

A drain of the MOS transistor Q8 is grounded, a gate of the MOS transistor Q8 receives a clock signal, and a source of the MOS transistor Q8 is connected to a source of the MOS transistor Q6.

A gate of the MOS transistor Q5 is connected to a gate of the MOS transistor Q6, a drain of the MOS transistor Q5 is connected to a drain of the MOS transistor Q6, the gate of the MOS transistor Q5 is connected to the signal distribution module, and the drain of the MOS transistor Q5 is connected to the time sequence module.

The second-stage broadband signal is input from the gate of the MOS transistor Q5, and output from the drain of the MOS transistor Q5.

It should be noted that the operational amplifying module is configured to amplify the second-stage broadband signal obtained after the first-stage broadband signal passes through the signal distribution module to obtain a third-stage broadband signal such that the third-stage broadband signal meets a requirement of a next-stage module for an input amplitude. Currents in the operational amplifying module are all dynamic currents, and the operational amplifying module may also be referred to as a fully-dynamic operational amplifying module.

Figure 4:
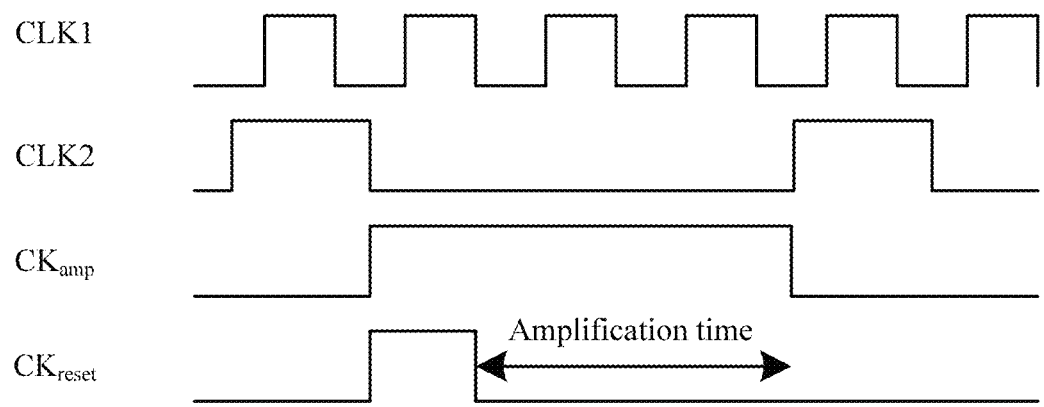
FIG. 4 is a schematic diagram of a correspondence between voltages in a signal distribution circuit according to an embodiment of this application.

It can be understood that, to reduce power consumption, the operational amplifying module is turned on and operates only when amplification processing is performed, and the time sequence module controls the operational amplifying module to be turned on and turned off. For example, when a voltage at CKreset changes from a low electrical level state to a high electrical level state, a voltage at CKamp changes from a low electrical level state to a high electrical level state, and the operational amplifying module is turned on. When a voltage at CKreset changes from a high electrical level state to a low electrical level state, a voltage at CKamp remains at a high electrical level state for preset duration. The preset duration is total duration of three periods of the clock signal CLK1, and the operational amplifying module is turned on. When the preset duration expires, the voltage at CKamp changes from the high electrical level state to a low electrical level state, and the operational amplifying module is turned off. Each voltage of the timing circuit module corresponds to a clock signal, and a specific correspondence is shown in FIG. 4.

In an operational implementation, the time sequence module includes a switch S1, a switch S2, and a capacitor C5.

Referring to FIG. 3, in an optional embodiment, a first terminal of the switch S1 is connected to the operational amplifying module, a second terminal of the switch S1 is connected to a first terminal of the switch S2, and the second terminal of the switch S1 is connected to a first terminal of the capacitor C5.

A second terminal of the switch S2 is grounded, and a second terminal of the capacitor C5 is grounded.

The third-stage broadband signal is input from the first terminal of the switch S1, and output from the second terminal of the switch S1.

Figure 5:
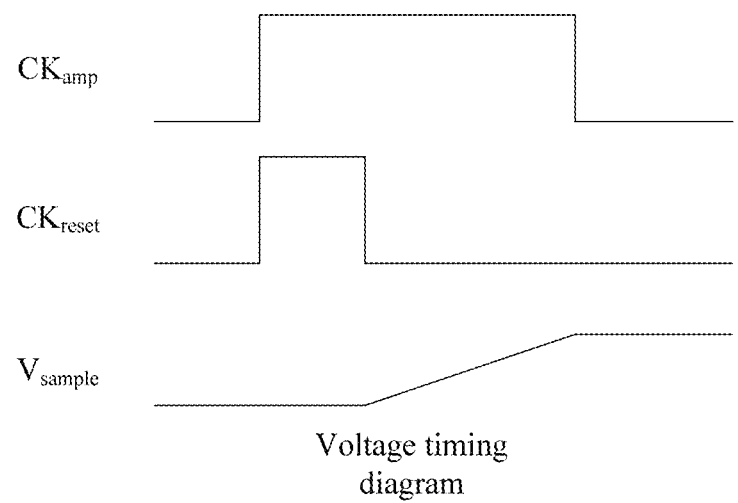
FIG. 5 is a schematic diagram of a change of voltages in a time sequence module according to an embodiment of this application.

It should be noted that, in addition to controlling an amplification time of the operational amplifying module and adjusting an amplification gain, the time sequence module may be further configured to perform analog correction in case of a gain mismatch between channels. In a working process of the time sequence module, voltages of switch components change correspondingly, as shown in FIG. 5.

In an operational implementation, the feedback circuit module includes a common-mode obtaining circuit, a low-speed analog to digital converter, a digital signal processor, and a common-mode configuration circuit.

It should be noted that the feedback circuit module is mainly configured to resolve a problem that, in a working process of a pseudo-differential operational amplifier, an optimum common-mode input changes due to a change of a power source and a temperature.

As shown in FIG. 3, in this embodiment of this application, the signal distribution module includes four first-stage switch submodules. An output of each first-stage switch submodule is connected to inputs of four second-stage switch submodules. To be specific, the signal distribution module includes 16 distribution circuit branches with a same structure. Each distribution circuit branch is connected to one operational amplifying module to amplify an amplitude of a broadband signal and meet an input requirement of a next-stage module. An output of each operational amplifying module is connected to the time sequence module, each time sequence module includes five amplification timing branches with a same structure, and the feedback circuit module obtains a feedback voltage from the output of the operational amplifying module.

It should be noted that a quantity of distribution circuit branches of the signal distribution module and a quantity of branches of the time sequence module may be set based on an actual status. For example, the distribution circuit branches may be set to a 5×5 circuit structure, the branches of the time sequence module may be set to a structure of four branches, and details are not limited herein.

It can be understood that a partial structure not shown in FIG. 3 is a circuit part to which the signal Vin is connected. The circuit structure is the same as that to which the signal Vip is connected. The structure includes a signal distribution module and an operational amplifying module. A structure of the signal distribution module, a structure of the operational amplifying module, and a connection relationship are the same as those shown in the figure. Each operational amplifying module is connected to a time sequence module with a same structure.

Figure 6:
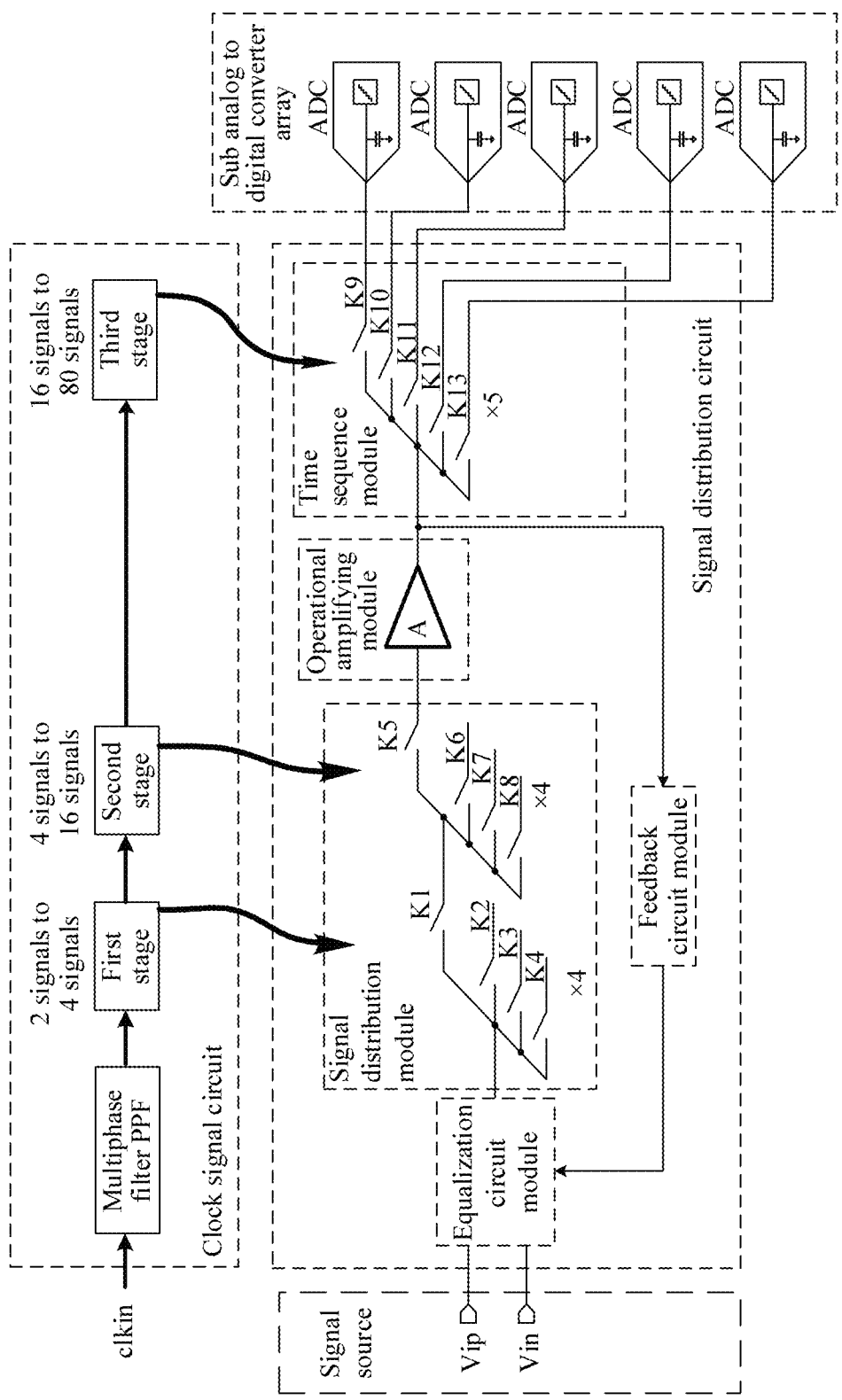
FIG. 6 is a schematic diagram of an embodiment of a signal distribution circuit system according to an embodiment of this application.

Referring to FIG. 6, an embodiment of a signal distribution circuit system in an embodiment of this application includes a signal source, a clock signal circuit, a signal distribution circuit, and a sub analog to digital converter array.

The signal source is configured to provide a broadband signal.

The clock signal circuit is configured to control a distribution process of the broadband signal using the signal distribution circuit.

The signal distribution circuit is configured to distribute the broadband signal.

The sub analog to digital converter array is configured to convert the distributed broadband signal from an analog signal into a digital signal.

The signal distribution circuit is the signal distribution circuit in this embodiment of this application, and is configured to increase broadband signal bandwidth and improve broadband signal linearity.

Persons skilled in the art may clearly understand that, for convenience and brevity of description, for a detailed working process of the foregoing system, device, and unit, reference may be made to a corresponding process in the foregoing method embodiments, and details are not described herein again.

In the several embodiments provided in this application, it should be understood that the disclosed system, device, and method may be implemented in other manners. For example, the described device embodiment is merely an example. For example, the unit division is merely logical function division and may be other division in actual implementation. For example, a plurality of units or components may be combined or integrated into another system, or some features may be ignored or may not be performed. In addition, the shown or discussed mutual couplings or direct couplings or communication connections may be implemented using some interfaces. The indirect couplings or communication connections between the devices or units may be implemented in electrical, mechanical, or other forms.

The units described as separate parts may or may not be physically separated, and parts shown as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to other approaches, or all or some of the technical solutions may be implemented in a form of a software product. The computer software product is stored in a storage medium and includes several instructions for instructing a computer device (which may be a personal computer, a server, a network device, or the like) to perform all or some of the steps of the methods described in the embodiments of this application. The foregoing storage medium includes any medium that can store program code, such as a universal serial bus (USB) flash drive, a removable hard disk, a read-only memory (ROM), a random access memory (RAM), a magnetic disk, or an optical disc.

The foregoing embodiments are merely intended to describe the technical solutions of this application, but not to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A signal distribution circuit, comprising:
an equalization circuit configured to:
   collect an initial broadband signal;
   perform amplitude attenuation processing on the initial broadband signal to obtain a first-stage broadband signal; and
   transmit the first-stage broadband signal;
a signal distributor coupled to the equalization circuit and configured to:
   receive the first-stage broadband signal;
   distribute the first-stage broadband signal to obtain a plurality of same second-stage broadband signals; and
   transmit the same second-stage broadband signals;
an operational amplifying circuit coupled to the signal distributor and configured to:
   receive the same second-stage broadband signals;
   perform amplification processing on a second-stage broadband signal of the second-stage broadband signals-to obtain a third-stage broadband signal; and
   transmit the third-stage broadband signal;
a feedback circuit coupled to the operational amplifying circuit and configured to:
   receive the third-stage broadband signal; and
   feedback the third-stage broadband signal to the equalization circuit, and
a time sequence circuit coupled to the operational amplifying circuit and configured to:
   receive the third-stage broadband signal;
   adjust an amplification gain of the third-stage broadband signal; and
   transmit the adjusted third-stage broadband signal to an analog to digital converter.

2. The signal distribution circuit of claim 1, wherein the equalization circuit comprises a first resistor (R1), a second resistor (R2), a third resistor (R3), a fourth resistor (R4), a first inductor (L1), a second inductor (L2), a third inductor (L3), a fourth inductor (L4), a first capacitor (C1), and a second capacitor (C2).

3. The signal distribution circuit of claim 2, wherein the R1 is coupled to the C1 in parallel, wherein a first terminal of the R1 is coupled to a first terminal of the C1, wherein a second terminal of the R1 is coupled to a second terminal of the C1, the R4 being coupled to the C2 in parallel, wherein a first terminal of the R4 is coupled to a first terminal of the C2, wherein a second terminal of the R4 is coupled to a second terminal of the C2, wherein the L1 is coupled to the R1 in series, wherein a first terminal of the L1 is coupled to a signal source (Vip), wherein a second terminal of the L1 is coupled to the first terminal of the R1, wherein the second terminal of the R1 is coupled to a common-mode configuration circuit of the feedback circuit using the L2 and the R2, wherein the L4 is coupled to the R4 in series, wherein the first terminal of the L4 is coupled to another signal source (Vin), wherein a second terminal of the L4 is coupled to a first terminal of the R4, and wherein the second terminal of the R4 is coupled to the common-mode configuration circuit of the feedback circuit using the L3 and the R3.

4. The signal distribution circuit of claim 1, wherein the signal distributor comprises four first-stage switching circuits, wherein all of the first-stage switching circuits are coupled in parallel, wherein each first-stage switching circuit is coupled to four second-stage switching circuits, wherein all of the second-stage switching circuits are coupled in parallel, wherein a second-stage switching circuit is coupled to a sampling capacitor (Cs), and wherein the second-stage switching circuits has a same structure as that of a first-stage switching circuit.

5. The signal distribution circuit of claim 4, wherein the each first-stage switching circuit comprises:
- a first metal-oxide semiconductor (MOS) transistor (Q1);
- a second MOS transistor (Q2) coupled to the Q1, wherein a source of the Q1 is coupled to a gate of the Q2, wherein a gate of the Q1 is coupled to a bias voltage (Vbottom), wherein a drain of the Q2 is coupled to the equalization circuit;
- a first amplifier (A1) coupled to each of the Q1 and the Q2, wherein an input terminal of the A1 is configured to receive a clock signal; and
- a third capacitor (C3) coupled to the A1, the Q1, and the Q2, wherein the second-stage switching circuit comprises:
  - a third MOS transistor (Q3);
  - a fourth MOS transistor (Q4) coupled to the Q3;
  - a second amplifier (A2) coupled to each of the Q3 and the Q4; and
  - a fourth capacitor (C4) coupled to the A2, the Q3, and the Q4, wherein a drain of the Q1 is coupled to a power source (AVDD), wherein a drain of the Q3 is coupled to the AVDD, wherein a source of the Q3 is coupled to a gate of the Q4, wherein a gate of the Q3 is coupled to the Vbottom, wherein a source of the Q2 is coupled to a drain of the Q4, wherein a source of the Q4 is coupled to the operational amplifying circuit, wherein an output terminal of the A1 is coupled to one terminal of the C3, and wherein a second terminal of the C3 is coupled to the source of the Q1, wherein an input terminal of the A2 is configured to receive another clock signal, wherein an output terminal of the A2 is coupled to one terminal of the C4, wherein a second terminal of the C4 is coupled to the source of the Q3, and wherein the first-stage broadband signal is input to the drain of the Q2, and wherein the first-stage broadband signal is output from the source of the Q4.

6. The signal distribution circuit of claim 1, wherein the operational amplifying circuit comprises:
- a fifth metal-oxide semiconductor (MOS) transistor (Q5);
- a sixth MOS transistor (Q6) coupled to the Q5;
- a seventh MOS transistor (Q7) coupled to the Q5; and
- an eighth MOS transistor (Q8) coupled to the Q6.

7. The signal distribution circuit of claim 6, wherein a drain of the Q7 is coupled to a power source (AVDD), wherein a gate of the Q7 is configured to receive a clock signal, wherein a source of the Q7 is coupled to a source of the Q5, wherein a drain of the Q8 is grounded, wherein a gate of the Q8 is configured to receive another clock signal, wherein a source of the Q8 is coupled to a source of the Q6, wherein a gate of the Q5 is coupled to a gate of the Q6, wherein a drain of the Q5 is coupled to a drain of the Q6, wherein the gate of the Q5 is coupled to the signal distributor, wherein the drain of the Q5 is coupled to the time sequence circuit, wherein the gate of the Q5 is configured to receive the second-stage broadband signal, and wherein the drain of the Q5 is configured to output the second-stage broadband signal.

8. The signal distribution circuit of claim 1, wherein the time sequence circuit comprises:
- a first switch (S1);
- a second switch (S2) coupled to the S1; and
- a fifth capacitor (C5) coupled to the S2 and the S1.

9. The signal distribution circuit of claim 8, wherein a first terminal of the S1 is coupled to the operational amplifying circuit, wherein a second terminal of the S1 is coupled to a first terminal of the S2, wherein the second terminal of the S1 is coupled to a first terminal of the C5, wherein a second terminal of the S2 is grounded, wherein a second terminal of the C5 is grounded, wherein the first terminal of the S1 is configured to receive the third-stage broadband signal and wherein the second terminal of the S1 is configured to output the third-stage broadband signal.

10. The signal distribution circuit of claim 1, wherein the feedback circuit comprises:
- a common-mode obtaining circuit;
- a low-speed analog to digital converter coupled to the common-mode obtaining circuit;
- a digital signal processor coupled to the low-speed analog to digital converter; and
- a common-mode configuration circuit coupled to the digital signal processor.

11. The signal distribution circuit of claim 1, wherein the equalization circuit further comprises a passive broadband equalization circuit.

12. The signal distribution circuit of claim 1, wherein the equalization circuit comprises:
- a first inductor (L1) coupled to a first signal source (Vip); and
- a second inductor (L4) coupled to a second signal source (Vin).

13. The signal distribution circuit of claim 1, wherein the equalization circuit further comprises:
- a first resistor (R1) coupled in series to the L1;
- a first capacitor (C1) coupled in parallel to the R1;
- a second resistor (R4) coupled in series to the L4; and
- a second capacitor (C2) coupled in parallel to the R4.

14. A signal distribution circuit system, comprising:
- a signal source configured to provide an initial broadband signal;
- a clock signal circuit coupled to the signal source and configured to control distribution of the initial broadband signal,
- a signal distribution circuit coupled to the clock signal circuit and configured to distribute the initial broadband signal, wherein the signal distribution circuit comprises:
  - an equalization circuit configured to:
    - collect the initial broadband signal;
    - perform amplitude attenuation process on the initial broadband signal to obtain a first-stage broadband signal; and
    - transmit the first-stage broadband signal,
  - a signal distributor coupled to the equalization circuit and configured to:
    - receive the first-stage broadband signal;
    - distribute the first-stage broadband signal to obtain a plurality of same second-stage broadband signals; and
    - transmit the same second-stage broadband signals
  - an operational amplifying circuit coupled to the signal distributor and configured to:
    - receive the same second-stage broadband signals;
    - perform amplification process on a second-stage broadband signal of the second-stage broadband signals to obtain a third-stage broadband signal; and
    - transmit the third-stage broadband signal;
  - a feedback circuit coupled to the operational amplifying circuit and configured to:
    - receive the third-stage broadband signal; and
    - feedback the third-stage broadband signal, and
  - a time sequence circuit coupled to the operational amplifying circuit and configured to:

receive the third-stage broadband signal;
adjust an amplification gain of the third-stage broadband signal; and
transmit the adjusted third-stage broadband signal to a sub analog to digital converter array, wherein the sub analog to digital converter array is coupled to the signal distribution circuit and configured to convert the adjusted third-stage broadband signal from an analog signal into a digital signal.

15. The signal distribution circuit system of claim 14, wherein the equalization circuit comprises:
a first inductor (L1) coupled to a first signal source (Vip); and
a second inductor (L4) coupled to a second signal source (Vin).

16. The signal distribution circuit system of claim 15, wherein the equalization circuit further comprises:
a first resistor (R1) coupled in series to the L1;
a first capacitor (C1) coupled in parallel to the R1;
a second resistor (R4) coupled in series to the L4; and
a second capacitor (C2) coupled in parallel to the R4.

17. The signal distribution circuit system of claim 16, wherein the equalization circuit further comprises:
a third inductor (L3) coupled to the R4;
a third resistor (R3) coupled to the R3 and the R4;
a fourth inductor L2 coupled to the R1; and
a fourth resistor (R2) coupled to the L2 and the R3.

18. The signal distribution circuit system of claim 16, wherein a first terminal of the R1 is coupled to a first terminal of the C1, wherein a second terminal of the R1 is coupled to a second terminal of the C1, wherein a first terminal of the R4 is coupled to a first terminal of the C2, wherein a second terminal of the R4 is coupled to a second terminal of the C2, wherein a first terminal of the L1 is coupled to the Vip, wherein a second terminal of the L1 is coupled to the first terminal of the R1, wherein the second terminal of the R1 is coupled to a common-mode configuration circuit of the feedback circuit using the L2 and the R2, wherein the first terminal of the L4 is coupled to the Vin, wherein a second terminal of the L4 is coupled to a first terminal of the R4, and wherein the second terminal of the R4 is coupled to the common-mode configuration circuit of the feedback circuit using the L3 and the R3.

19. The signal distribution circuit system of claim 16, wherein the signal distributor comprises four first-stage switching circuits, wherein all of the first-stage switching circuits are coupled in parallel, wherein each of the first-stage switching circuits are coupled to four second-stage switching circuits, wherein all of the second-stage switching circuits are coupled in parallel, wherein a second-stage switching circuit is coupled to a sampling capacitor (Cs), and wherein the second-stage switching circuits has a same structure as that of a first-stage switching circuit.

20. The signal distribution circuit system of claim 19, wherein the each first-stage switching circuit comprises:
a first metal-oxide semiconductor (MOS) transistor (Q1);
a second MOS transistor (Q2) coupled to the Q1, wherein a source of the Q1 is coupled to a gate of the Q2, wherein a gate of the Q1 is coupled to a bias voltage (Vbottom), wherein a drain of the Q2 is coupled to the equalization circuit;
a first amplifier (A1) coupled to each of the Q1 and the Q2, wherein an input terminal of the A1 is configured to receive a clock signal; and
a third capacitor (C3) coupled to the A1, the Q1, and the Q2, wherein the second-stage switching circuit comprises:
a third MOS transistor (Q3);
a fourth MOS transistor (Q4) coupled to the Q3;
a second amplifier (A2) coupled to each of the Q3 and the Q4; and
a fourth capacitor (C4) coupled to the A2, the Q3, and the Q4, wherein a drain of the Q1 is coupled to a power source (AVDD), wherein a drain of the Q3 is coupled to the AVDD, wherein a source of the Q3 is coupled to a gate of the Q4, wherein a gate of the Q3 is coupled to the Vbottom, wherein a source of the Q2 is coupled to a drain of the Q4, wherein a source of the Q4 is coupled to the operational amplifying circuit, wherein an output terminal of the A1 is coupled to one terminal of the C3, and wherein a second terminal of the C3 is coupled to the source of the Q1, wherein an input terminal of the A2 is configured to receive another clock signal, wherein an output terminal of the A2 is coupled to one terminal of the C4, wherein a second terminal of the C4 is coupled to the source of the Q3, and wherein the first-stage broadband signal is input to the drain of the Q2, and wherein the first-stage broadband signal is output from the source of the Q4.

* * * * *